United States Patent [19]

Fritz

[11] E Re. 29,258

[45] Reissued June 7, 1977

[54] COATED FERRITE RF FILTERS

[75] Inventor: William Baird Fritz, Hershey, Pa.

[73] Assignee: AMP Incorporated, Harrisburg, Pa.

[22] Filed: Jan. 22, 1975

[21] Appl. No.: 543,097

Related U.S. Patent Documents

Reissue of:

[64] Patent No.: 3,743,978
Issued: July 3, 1973
Appl. No.: 88,042
Filed: Nov. 9, 1970

U.S. Applications:

[63] Continuation-in-part of Ser. No. 883,501, Dec. 9, 1969, abandoned.

[52] U.S. Cl. ..... 333/70 S; 333/79

[51] Int. Cl.[2] ..... H03H 7/04; H03H 13/00; H03H 7/14; H01G 4/42

[58] Field of Search ..... 333/79, 84 R, 84 M, 333/70 R, 70 S; 317/256

[56] References Cited

UNITED STATES PATENTS

| | | | |
|---|---|---|---|
| 2,228,798 | 1/1941 | Wassermann | 178/45 |
| 2,443,109 | 6/1948 | Linder | 333/79 |
| 2,611,094 | 9/1962 | Rex | 334/4 |
| 2,782,381 | 2/1957 | Dyke | 333/79 |
| 3,257,629 | 6/1966 | Kornreich | 333/79 |
| 3,275,953 | 9/1966 | Coda et al. | 333/79 |
| 3,289,118 | 11/1966 | Garstang | 333/79 |
| 3,380,004 | 4/1968 | Hansen | 333/79 |
| 3,435,387 | 3/1969 | Reinke | 333/79 |
| 3,447,143 | 5/1969 | Hair | 333/31 |
| 3,456,215 | 7/1969 | Denes | 333/79 |
| 3,458,837 | 7/1969 | Ngo | 333/73 |
| 3,566,311 | 2/1971 | Buck | 333/24.1 |
| 3,588,758 | 6/1971 | Hurst | 333/79 |
| 3,644,850 | 2/1972 | Ho | 333/84 M X |

FOREIGN PATENTS OR APPLICATIONS

| | | | |
|---|---|---|---|
| 781,320 | 8/1957 | United Kingdom | 333/79 |

*Primary Examiner*—Eli Lieberman
*Assistant Examiner*—Marvin Nussbaum
*Attorney, Agent, or Firm*—Gerald K. Kita

[57] ABSTRACT

In a low pass RF filter, a coating of barium titanate is applied to a ferrite substrate. In one embodiment, the RF filter is an extruded tube of ferrite coated with barium titanate. The tube is used as an RF filter for a connector pin. In another embodiment, a thin strip of ferrite is coated with barium titanate. This forms a filter strip for use on circuit boards or for use as a high capacity lossy power bus.

14 Claims, 10 Drawing Figures

COATED FERRITE RF FILTERS

Matter enclosed in heavy brackets [ ] appears in the original patent but forms no part of this reissue specification; matter printed in italics indicates the additions made by reissue.

CROSS REFERENCE TO RELATED APPLICATION

This application is a continuation-in-part of my prior copending application Ser. No. 883,501, filed Dec. 9, 1969 now abandoned, and to which priority is asserted as to subject matter common therewith.

BACKGROUND OF THE INVENTION

This invention relates to low pass RF filters and more particularly to a layer of dielectric material deposited on a ferrite substrate to form a filter.

Low pass RF filters are used extensively in electrical circuits to suppress stray radio frequency noise. Lumped impedance filters perform well at the lower frequencies but resonances limit their utility as the frequency is increased. Also, these type filters are large in size compared to the circuits with which they are used. To overcome this, RF filters of the type disclosed in U.S. Pat. No. 3,275,953 — Coda et al. were developed and used as feed through filters or on connector pins. These filters are small and have good insertion loss characteristics at high frequencies. However, there are several problems associated with filters of the type shown in the Coda et al. patent. First, they include an inner sleeve of ferrite coated with a metal layer and an outer metallized ceramic sleeve, usually barium titanate. Therefore, they require several fabrication steps. Also, the capacity is limited by the thickness to which the outer sleeve can be made usually 8 to 10 mils minimum.

Finally, even though resonances are minimized at high frequencies, the filter, because of the type of construction, is still lumped at the lower frequencies of interest, 1–50 megahertz. Accordingly, resonances can result at these frequencies. It is desirable then that filters of this type have a completely distributed impedance, that they be easier to fabricate and that they not be limited in capacity by the titanate sleeve thickness.

SUMMARY OF THE INVENTION

This invention concerns an RF filter in which a thin coating of dielectric material is laid down on a ferrite substrate. In one specific embodiment a layer approximately 2 mils thick of barium titanate is laid down on the ferrite substrate to produce an electrical filter. The filter produced in this manner has low cost because fewer fabrication steps are involved. Also, the electrical properties are better than prior art filters. The impedance is completely distributed and the filter has a high capacity.

In one form of the invention, the filter is an extruded tube of ferrite upon which a layer of barium titanate has been deposited. These filters are used for connector pins.

In another form of the invention the filter is a thin strip of ferrite upon which a barium titanate layer has been deposited. These are used as filter strips, or filtered buses, for circuit boards.

The foregoing and other objects, features and advantages of the invention will be better understood from the following more detailed description, the drawings, and the claims.

DESCRIPTION OF A PARTICULAR EMBODIMENT

Figure 1:
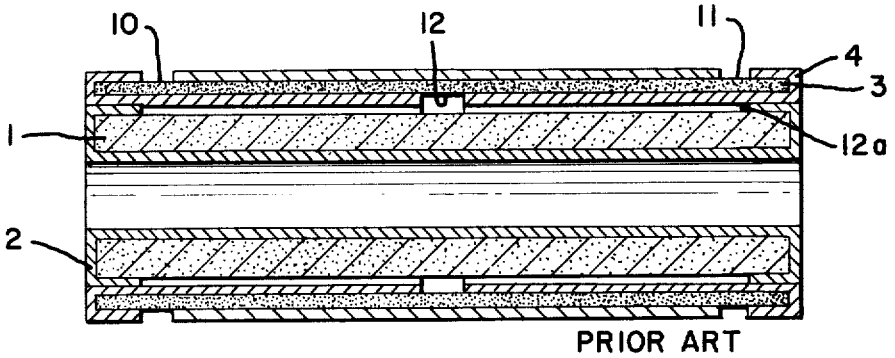
FIG. 1 depicts a prior art type of filter for a connector pin.

Referring to FIG. 1, most prior art connector pin filters are constructed of two concentric sleeves. The inner sleeve includes an extruded ferrite tube 1 with metal plating 2. The outer sleeve includes barium titanate 3 with the metal plate 4. The two sleeves are joined together by conductive epoxy or by soldering. It will be appreciated that the fabrication process includes extruding two sleeves, two steps of plating, one for each sleeve, and the step of joining the two sleeves together.

Figure 2:
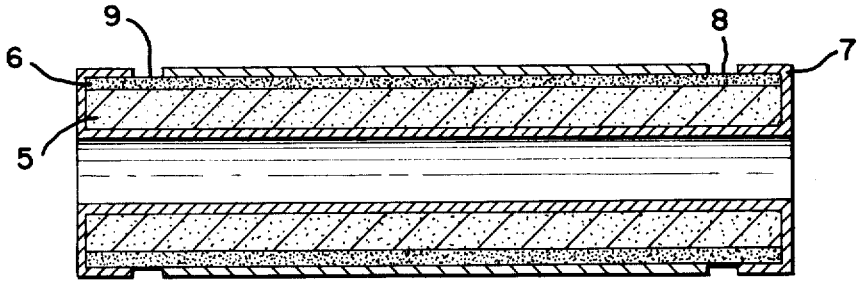
FIG. 2 depicts a filter for a connector pin constructed in accordance with the present invention.

Contrast this with a filter constructed in accordance with the present invention as depicted in FIG. 2. The extruded ferrite tube 5 is coated with the barium titanate layer 6. Barium titanate may be laid down on ferrite with several known techniques. Electrophoretic deposition is a particularly good technique for coating barium titanate on a ferrite tube. The electrophoretic deposition described in Senderoff et al. U.S. Pat. No. 2,843,541 may be used to lay down the barium titanate layer. After the barium titanate has been deposited on the ferrite, the device is metal plated, the metal plating being indicated at 7. Gaps 8 and 9 are left in the metal plating to isolate the ground and center pin electrodes.

Note that in FIG. 1 the same provision must be made for gaps 10 and 11 in the metal plating. Additionally, a gap 12 must be provided on the inside of sleeve 3. When the inner sleeve 1 is electroplated, a gap 12a must be provided so that the ferrite is not shielded out of the circuit. It can be seen that the fabrication of prior art devices include additional difficult fabrication steps not required in constructing the filter of this invention.

Figure 4:
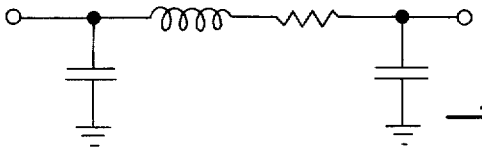
Fig. 4 PRIOR ART
FIG. 4 shows the equivalent circuit of a prior art type filter.
Figure 3A:
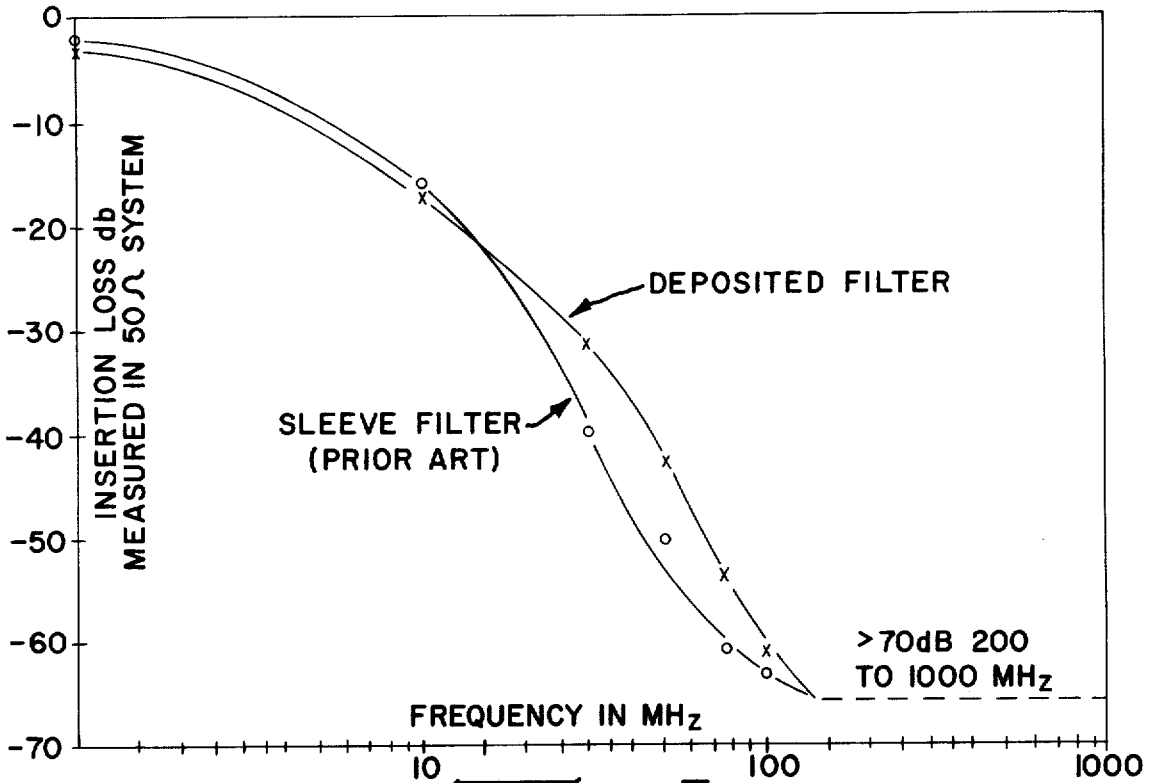
FIG. 3a shows the insertion loss versus frequency for the prior art filter and for the filter of this invention.
Figure 3B:
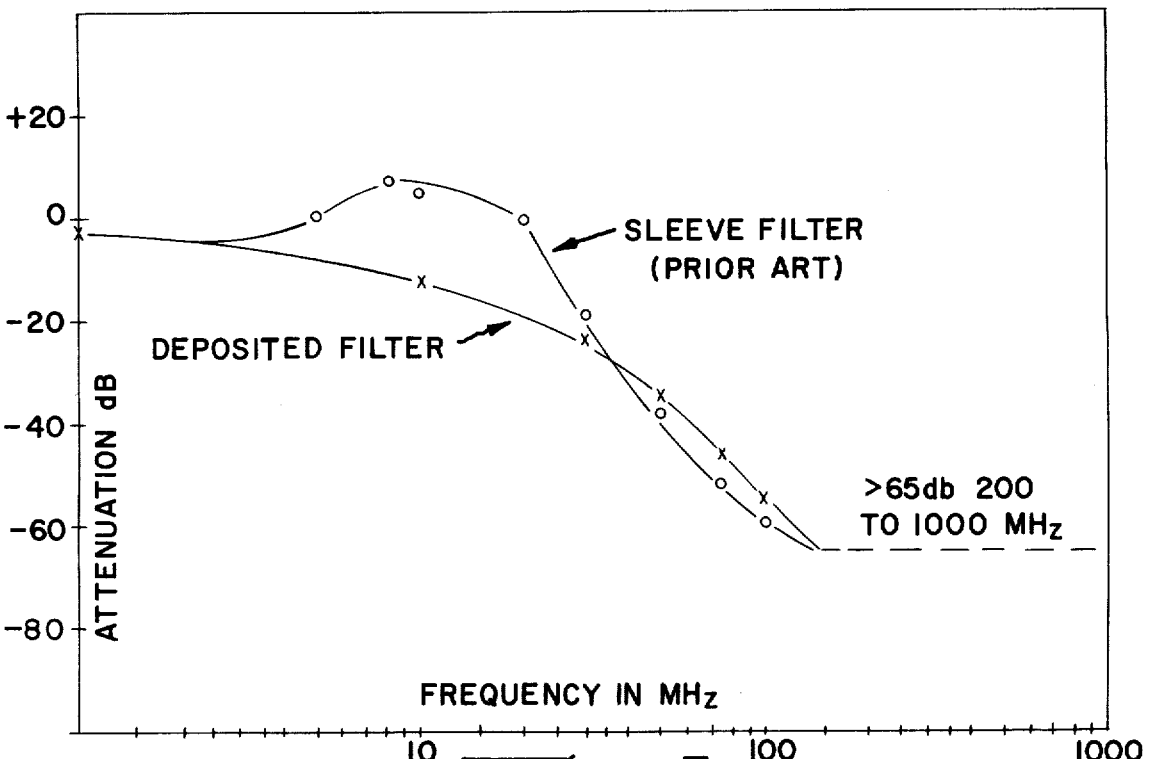
FIG. 3b shows the attenuation versus frequency for the prior art filter and for the filter of this invention.

The filter of this invention also has improved electrical characteristics over prior art filters. This can best be shown by an example. Two filters are constructed, one in accordance with the prior art and one in accordance with this invention. The filters were 0.1 inches in diameter by 0.465 inches long. The capacity of the prior art filter was 6,000 $\mu\mu$F. The capacity of the filter of this invention was 5,000 $\mu\mu$F. The insertion loss versus frequency of the filters as measured in a 50 ohm system is shown in FIG. 3a. This response for both filters is good. Note, however, that the attenuation of the two filters, shown in FIG. 36, is quite different and that the prior art filter actually shows an undesirable gain between 5 and 10 megahertz. This gain is the result of the shunt capacity resonating with the filter series inductance. These circuit elements are shown in the equivalent circuit of FIG. 4. Because the impedance of the circuit in which these filter devices are used is not always known or easily established, the prior art filter in actual use may show less loss or even a gain from that determined by measurement made in a circuit with predetermined source and load impedance, such as mil standard 220. The filter of this invention, because of its distributed construction and inherent low Q, does not show gain in the attenuation curve of FIG. 3b, regardless of the circuit impedances.

As previously pointed out, another advantage of this invention is that it is possible to get an extremely thin film of barium titanate, about 2 to 4 mils being common. This thin film gives a much higher capacity per unit length of filter and for a given dielectric constant there is more attenuation per unit length than in a conventional filter.

Figure 5:
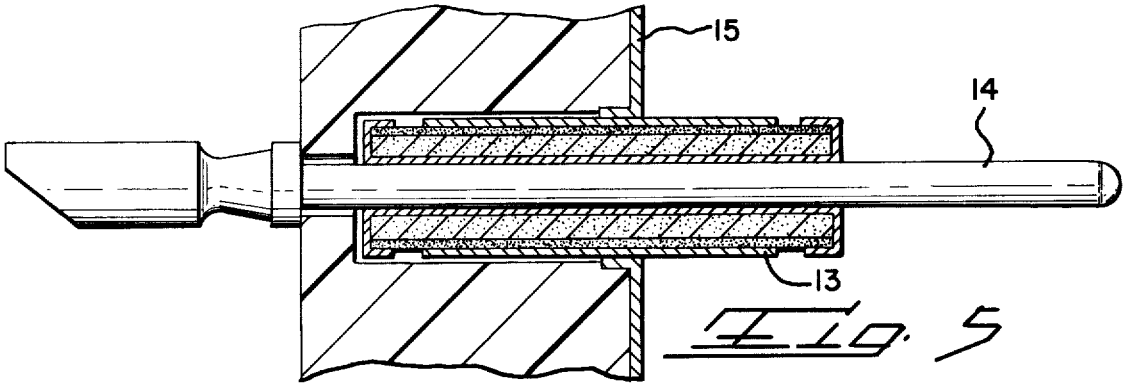
FIG. 5 shows the filter of the present invention in place on a connector pin.

FIG. 5 shows one of the filters constructed in accordance with the invention in place on a connector pin. The filter 13 is positioned over the connector pin 14. A ground plane 15 is snapped onto the filter to provide the ground connection. For a connector pin filter having a length of a 1 centimeter, the noise attenuation is approximately 60 db at 100 megahertz. That is, the noise power is reduced by a factor of $10^6$.

Figure 6:
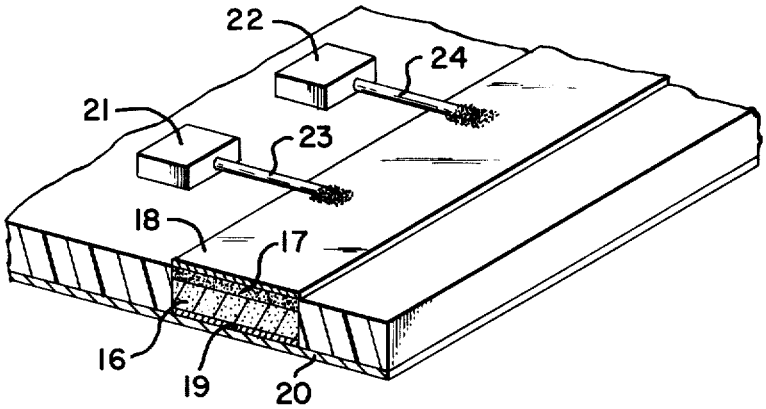
FIG. 6 shows the invention embodied in a filter strip for a circuit board.

FIG. 6 shows an embodiment of the invention in which a coated strip of ferrite is used as a filter strip for a circuit board. The strip of ferrite 16 has a layer of barium titanate 17 deposited thereon. The strip has a metal plating 18 on one side and a metal plating 19 on the other side. The metal plating 19 is soldered to the ground plane 20 of the circuit board. The circuit components 21 and 22 are connected to the RF filter strip by the leads 23 and 24 respectively. These leads are soldered to the metal plating 18.

In this form, the invention provides good filtering for components connected to the metal plating 18 which may be a DC bus. Particularly in digital circuits, when one of the circuits such as 21 or 22 is triggered, high frequencies are normally imposed on the DC bus. This high frequency noise may interfere with the other circuits on the board. However, the use of the lossy bus according to the present invention will isolate the components. Also, it will prevent noise from other sources from entering the power bus and possibly causing a malfunction.

In one actual application of the invention a ½ inch wide bus bar was constructed of the form shown in FIG. 6. The attenuation was 90 db per centimeter at 100 megahertz. Stated another way, the power of the noise was attenuated by a factor of $10^9$.

Many modifications of the invention will be apparent. While barium titanate has been described as a particularly good dielectric material, other dielectric materials with lower dielectric constants may be deposited on the ferrite as a means of controlling the cut off frequency of the filter. For example, a filter with a 2 mil epoxy coating resulted in a filter with a cut off frequency (frequency at which insertion loss is 3db) of 50 megahertz, whereas the equivalent filter with barium titanate had a cut off at 2 megahertz.

Figure 7:
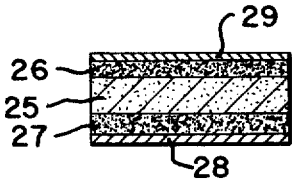
FIGS. 7–9 show modifications of the filter strip.

Various modifications of the filter strip may be made. For example, in FIG. 7 the ferrite 25 has coatings of barium titanate 26 and 27 on both sides. Conductive metal platings 28 and 29 are applied over the barium titanate. Such a filter strip has a higher breakdown voltage. However, it would also have lower attenuation for a given thickness of barium titanate.

Figure 8:
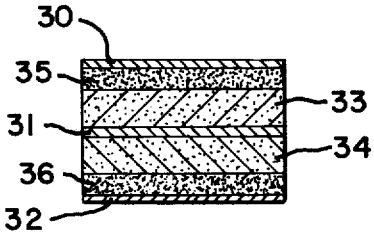

In FIG. 8 the layers 30, 31, and 32 are conductive metal coatings. Layers 33 and 34 are ferrite and layers 35 and 36 are barium titanate. The metal 31 may be the conductor and the metal coatings 30 and 32 the ground. This embodiment has a higher capacity and loss per unit length.

Figure 9:
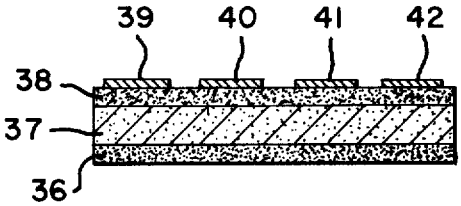

In FIG. 9 the filter strip includes a single ground conductor 36, a ferrite 37 and a barium titanate layer 38. Laid down on this are a plurality of metal conduction strips 39–42. This embodiment can be used where multiple circuits are required.

While the invention is particularly suitable for use with a ferrite substrate as previously described, the substrate may, in accordance with a further aspect of the invention, be constructed of other materials. One practical alternative in the use of a doped semiconducting ceramic material for the substrate. It is well known that the normally high resistivity of barium titanates can be greatly reduced by the introduction of proper additives. The resulting semiconductive barium titanates, produced by known methods of treatment referred to in U.S. Pat. No. 3,268,783 to Osamu Saburi, are termed "controlled valency semiconductive barium titanates." As is pointed out in the Saburi patent, semiconductive ceramic material can be produced via valency control and can be carried out upon members of the family of materials generically designated by $E^{2+}M^{4+}O_3^{2-}$, wherein E is an alkaline earth element material selected from the group consisting of barium, magnesium, calcium, strontium, lead and mixtures thereof, M is a metal chosen from the group consisting of titanium, tin, and zirconium, and O is of course oxygen. Barium titanate is one member of the aforesaid family of materials. As further pointed out in the Saburi patent, the additivès used for valence control may comprise a material A selected from the group consisting of yttrium, actinium, thorium, antimony, bismuth, the members of the rare earth elements, and mixtures thereof, or a material B taken from the group consisting of vanadium, niobium, tantalum, selenium, tellurium, tungsten, and mixtures thereof. The total amount of additive should be between 0.01 atomic percent to 0.50 atomic percent of the host material, the alkaline earth material E being the host with additive A, and the metal M being the host in the case of additive B. In FIGS. 1 and 2 of the Saburi patent, the semiconductive plate 3 is an illustration of a semiconductive barium titanate substrate in a capacitor device.

In accordance with this further aspect of the invention, the substrate may consist of a semiconducting ceramic, such as the aforementioned semiconductive barium titanate, which is then coated with a suitable dielectric material to produce a filter, the coating being deposited in the same manner as in the case of the ferrite substrate above. For example, a semiconducting barium titanate sleeve coated with a low conductivity titanate forms a large lossy capacitor. Such a device does not have the loss characteristics associated with the magnetic ferrite and it is not as effective as the ferrite device at high frequencies However, for some applications the filter constructed with a semiconducting ceramic substrate is quite satisfactory and can be inexpensively manufactured.

What is claimed is:

1. A [unitary] *composite ceramic* low pass filter element for mounting on a conductor of a low frequency transmission line to attenuate high frequencies thereon comprising, a conductive tubular member for receiving a conductor therein, a semiconductive substrate in the form of a sleeve secured to the outer surface of the tubular member in intimate engagement therewith, a *ceramic dielectric* layer [of dielectric material] covering the outer surface of the sleeve in direct intimate contact therewith, and an outer conductive layer disposed about and secured to the dielectric [material] *layer* substantially the length thereof for connecting the unitary filter element to ground.

2. The filter recited in claim 1 wherein said [substrate] *semiconductive substrate* is a [semi-conducting] ceramic.

3. The filter recited in claim 2 wherein the [semiconducting ceramic] *semiconductive substrate* is doped barium titanate.

4. The filter recited in claim 1 wherein said dielectric is undoped barium titanate.

5. The filter recited in claim 1 wherein the layer of dielectric material is coated thereon.

6. The filter recited in claim 1 wherein the tubular member is a metallic plating over the inner surface of the sleeve.

7. The filter recited in claim 5 wherein the outer conductive layer is metallic plating over said layer of dielectric material.

8. A [unitary] *composite ceramic* low pass filter strip for mounting on a circuit board provided with a ground plane conductor comprising, a substrate in the form of a flat strip of semiconductive material, a conductive metal plating on one surface of the substrate, a coating of *ceramic* dielectric material on the opposite surface of the substrate, and a conductive metal plating on the outer surface of the dielectric coating, one of said platings being connected to one terminal of a low frequency source and load, and the other plating being in conductive engagement with the ground plane conductor.

9. The filter of claim 8 in which the substrate is a semiconductive ceramic.

10. The filter of claim 8 in which the substrate is doped barium titanate.

11. The filter of claim 8 in which the dielectric is undoped barium titanate.

12. A [unitary] *composite ceramic* low pass filter element for mounting on a conductor of a low frequency transmission line to attenuate high frequencies thereon comprising, a conductive tubular member for receiving a conductor therein, a substrate of ferrite in the form of a sleeve secured to the outer surface of the tubular member, in intimate engagement therewith, a layer of *ceramic* dielectric material covering the outer surface of the sleeve in direct intimate contact therewith, and an outer conductive layer disposed about and secured to the dielectric material substantially the length thereof for connecting the unitary filter element to the ground.

13. The filter recited in claim 12 wherein said dielectric is undoped barium titanate.

*14. The filter of claim 8 in which the substrate is a ferrite.*

* * * * *